US006572252B1

United States Patent
Rangarajan et al.

(10) Patent No.: US 6,572,252 B1
(45) Date of Patent: Jun. 3, 2003

(54) SYSTEM AND METHOD FOR ILLUMINATING A SEMICONDUCTOR PROCESSING SYSTEM

(75) Inventors: Bharath Rangarajan, Santa Clara, CA (US); Bhanwar Singh, Morgan Hill, CA (US); Khoi A. Phan, San Jose, CA (US); Bryan K. Choo, Mountain View, CA (US); Ramkumar Subramanian, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/591,085

(22) Filed: Jun. 9, 2000

Related U.S. Application Data

(60) Provisional application No. 60/199,479, filed on Apr. 25, 2000.

(51) Int. Cl.[7] ................ F21V 7/04; F21V 5/00
(52) U.S. Cl. .............. 362/551; 362/576; 362/559
(58) Field of Search ............... 362/551, 559, 362/562, 125, 576, 268, 276, 33, 575, 89; 438/27, 65; 361/213; 356/345, 450; 156/345

(56) References Cited

U.S. PATENT DOCUMENTS

| | | | |
|---|---|---|---|
| 4,631,675 A | * | 12/1986 | Jacobsen et al. ............ 362/552 |
| 4,732,785 A | | 3/1988 | Brewer |
| 5,095,252 A | * | 3/1992 | Kurth ..................... 315/241 S |
| 5,209,813 A | | 5/1993 | Oshida et al. |
| 5,455,894 A | | 10/1995 | Conboy et al. |
| 5,487,127 A | * | 1/1996 | Gronet et al. ............... 392/416 |
| 5,725,663 A | | 3/1998 | Parrette |
| 5,788,868 A | | 8/1998 | Itaba et al. |
| 5,879,577 A | | 3/1999 | Weng et al. |
| 5,923,915 A | | 7/1999 | Akimoto et al. |
| 5,971,577 A | * | 10/1999 | Mori et al. ................ 362/575 |
| 5,985,357 A | | 11/1999 | Sanada |
| 6,002,572 A | * | 12/1999 | Hirose et al. ............... 361/213 |
| 6,020,602 A | | 2/2000 | Sugawara et al. |
| 6,034,771 A | * | 3/2000 | Rangarajan et al. ........ 356/450 |
| 6,106,662 A | * | 8/2000 | Bibby et al. ................ 156/345 |
| 6,229,595 B1 | | 5/2001 | McKinley et al. |
| 6,262,795 B1 | | 7/2001 | Baker et al. |

FOREIGN PATENT DOCUMENTS

| | | |
|---|---|---|
| EP | 0 035 673 B1 | 2/1981 |
| EP | 0 448 735 A1 B1 | 10/1991 |
| EP | 0 644 574 * | 3/1995 |
| EP | 0 644 574 A1 B1 | 3/1995 |
| EP | 0 744 665 A1 B1 | 11/1996 |
| EP | 11054416 B1 | 2/1999 |

OTHER PUBLICATIONS

Online English translation of JP 11–54416.
PCT International Search Report, International Application No. PCT/US01/09507, International Filing Date Mar. 22, 2001, 4 pgs.

* cited by examiner

Primary Examiner—Sandra O'Shea
Assistant Examiner—Bao Truong
(74) Attorney, Agent, or Firm—Eschweiler & Associates, LLC

(57) ABSTRACT

The present invention relates to illuminating an interior portion of a processing chamber in a semiconductor processing system. A fiber optic light source is operatively associated with the processing chamber to illuminate the interior of the chamber to facilitate viewing the interior of the chamber.

14 Claims, 5 Drawing Sheets

SYSTEM AND METHOD FOR ILLUMINATING A SEMICONDUCTOR PROCESSING SYSTEM

This application claims benefit of provisional application 60/199,479 filed Apr. 25, 2000.

TECHNICAL FIELD

The present invention relates generally to semiconductor processing and, more particularly, to a system and method for illuminating a semiconductor processing system.

BACKGROUND OF THE INVENTION

The tendency of semiconductor devices such as integrated circuits (IC) and large scale integrated circuits (LSIC) toward minuteness has rapidly progressed, and higher accuracy and efficiency have been required of apparatuses for manufacturing such semiconductor devices. Semiconductor integrated circuits undergo a variety of processing steps during manufacture, such as masking, resist coating, developing, etching, and deposition. In many of these steps, material is applied or removed from a substrate within a processing chamber having a controlled environment.

In order to remain competitive, manufacturers of semiconductor devices continually strive to improve production yields, while at the same time seeking to reduce associated manufacturing costs. As customers require larger quantities of semiconductor products, manufacturers increasingly seek equipment capable of operating efficiently for producing products commensurate with their customers' expectations. Because floor space is at a premium in most manufacturing facilities (due to the clean room environment necessary for fabrication of semiconductor devices), the manufacturers of semiconductor processing equipment have responded by producing semiconductor processing systems having vertically integrated processing units. One particular example of a vertically integrated semiconductor processing system is a coater/developer track system in which multiple coater and/or developer units are vertically stacked on top of each other, typically at the upper part of the track system.

SUMMARY OF THE INVENTION

The present invention relates to a system and method for illuminating a semiconductor processing system.

A light source, such as a fiber optic light source, is operatively associated with a processing chamber of a semiconductor processing system. The light source illuminates the interior of the chamber to facilitate visual inspection by a technician so as to, for example, assist in troubleshooting and/or other monitoring within the chamber. Advantageously, the light source dissipates relatively little heat so as not to adversely react with chemicals which may be present in the processing chamber. The light source may be a yellow wavelength light or any light color that will not expose substantially the resist.

One aspect of the present invention relates to a system for illuminating a semiconductor processing system. The system includes a processing chamber of the processing system having an interior. A fiber optic light source is associated with the chamber for illuminating the interior of the chamber so that the contents of the chamber are visible.

Another aspect of the present invention relates to a system for illuminating a semiconductor processing system. The system includes illumination means operatively associated with an interior of an enclosed processing chamber of the processing system for illuminating the interior of the chamber.

Another aspect of the present invention relates to a method for visibly illuminating an interior of a processing chamber in a semiconductor processing system. The method includes using a fiber optic light source to illuminate the interior of the chamber to facilitate viewing the interior of the chamber.

To the accomplishment of the foregoing and related ends, the invention, then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
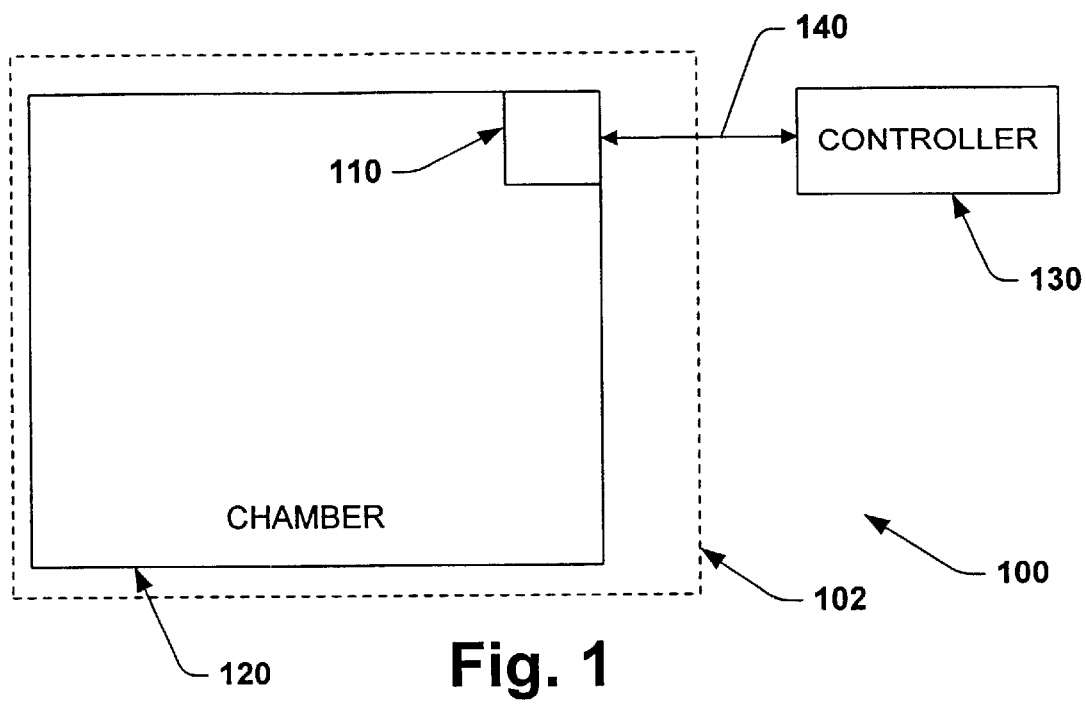
FIG. 1 is a schematic block diagram of an enclosed chamber of a semiconductor processing system equipped with an illuminating device in accordance with the present invention.

The present invention will now be described with reference to the drawings, wherein like reference numerals are used to refer to like elements throughout.

FIG. 1 is a schematic block diagram of a system 100 for illuminating a semiconductor processing system 102 in accordance with the present invention. The system 100 includes an illuminating device 110, preferably a fiber optic light source, associated with an enclosed chamber 120 of the processing system 102. In particular, at least part of the illuminating device 110 is located within the interior of the chamber 120 for illuminating the contents of the chamber. The illuminating device 110 is operatively connected to a controller 130 via a communications link 140 for controlling operation of the illuminating device.

The controller 130 may be located remote from the chamber 120, such as located at a console outside a clean room in which the processing system 102 is situated. Alternatively, the controller 130 may be integrally connected with the system 102 in which the chamber 120 is mounted. Depending on, for example, the location of the controller 130 relative to the system 102, the communications link 140 between the illuminating device 110 and the controller may be wired or wireless. The term "wired" as used herein is intended to include any physical communications link, including, for example, an electrically conducting cable and a fiber optical link. Similarly, the term "wireless" is intended to cover any form of communication that utilizes air as a transmission medium, including, for example, electromagnetic, optical, and acoustic forms of communication links. The communication over the link 140 may be analog or digital. In addition, the communications link 140 may be bidirectional, in which operation of the illuminating device 110 is both controlled and monitored by the associated controller 130. For example, the illuminating device 110 may be manually activated by a switch device (not shown) operatively connected to the controller 130. Alternatively, the illuminating device 110 may be activated automatically, such as in response to sensing equipment (not shown) associated with the chamber 120 indicating that one or more conditions of the chamber 120 are not within expected operating parameters. In such situations, the controller 130 also may activate a warning alarm to assist the technician in troubleshooting efforts.

By way of example, the system 102 of FIG. 1 is a track system in which semiconductor wafers are loaded into, processed, and unloaded. In the track system, the chamber 120 is a part of a processing unit, such as a coater, developer, heating unit, cooling unit, etc. Wafers are placed into the processing chamber 120 of the respective unit and subjected to various controlled processes, such as resist coating, developing, heating, and/or cooling. The illuminating device 110 provides a mechanism which facilitates visual inspection by a technician, such as for visually monitoring the progress and/or troubleshooting within the processing chamber 120. According to one aspect of the present invention, the illuminating device 110 does not increase substantially the temperature within the processing chamber 120, thereby maintaining temperature uniformity therein.

Figure 2:
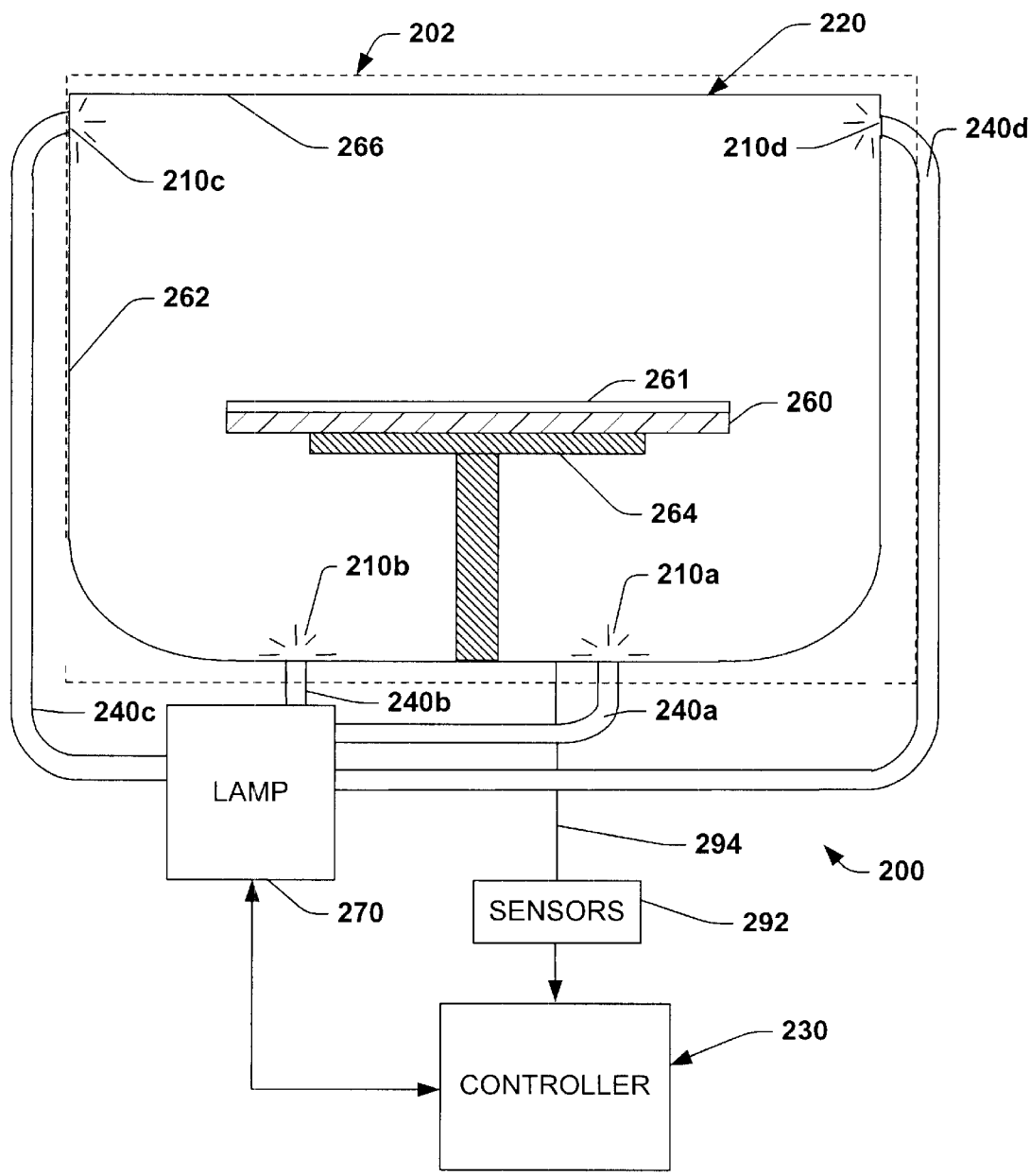
FIG. 2 is side sectional view of a processing chamber equipped with an illuminating device in accordance with the present invention.
Figure 3:
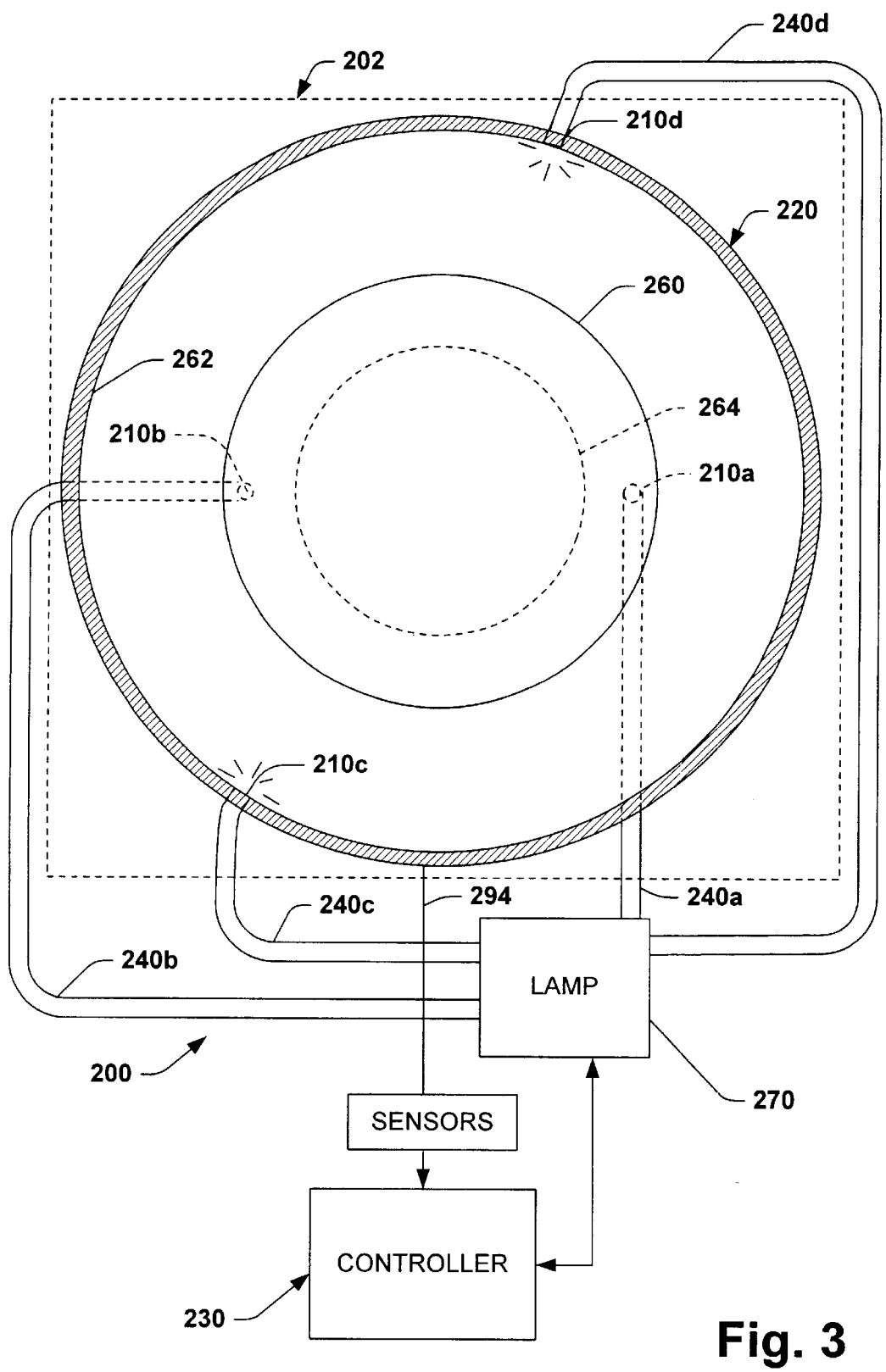
FIG. 3 is a sectional view taken along line 3—3 of the chamber of FIG. 2.

FIGS. 2 and 3 illustrate a schematic illustration of a system 200 for illuminating a processing chamber 220 of a semiconductor processing system in accordance with the present invention. The chamber 220 is configured for receiving and processing a wafer 260 in a predefined manner. In particular, the chamber 220 is a cup or container, such as part of a processing unit (e.g., a coater or developer) of a track system. The chamber 220 has a cylindrical sidewall 262 which encloses a rotatable chuck 264 onto which the wafer 260 (or other substrate) is mounted for processing. The chuck 264 typically includes a vacuum system (not shown) for holding the wafer 260 on its surface during processing.

In a spin processing unit, for example, a nozzle (not shown) typically supplies a predetermined amount of viscous material 261 (e.g., resist or solvent) onto the wafer 260. The chuck 264 and wafer 260 are then accelerated to and rotated at a certain speed, and centrifugal forces exerted on the viscous material cause the material 261 to disperse over the surface of the wafer. It will be appreciated that, for purposes of the present invention, the features of the illuminating system 200 are applicable to all types of wafer processing units.

In accordance with the present invention, one or more illuminating devices, suitably fiber optic light sources 210a, 210b, 210c, and 210d (hereinafter collectively referred to as 210), are operatively associated with the chamber 220 for illuminating the interior of the chamber. While one illuminating device 210 may be sufficient to illuminate the interior of the chamber 220, more than one illuminating device may be employed to provide additional illumination for selected portions within the chamber 220. By way of example, the illuminating devices 210a and 210b are mounted to the bottom of the chamber 220 for emitting light to illuminate a lower portion of the chuck 264 and the mounting arrangement of the wafer 260 and chuck. The other illuminating devices 210c and 210d are, for example, mounted to the sidewall 262 near the upper end of the chamber 220 in a diametrically opposed manner. The illuminating devices 210c and 210d emit light to illuminate the interior of the chamber 220 and the upper surface of the wafer 260 and/or chuck 264.

Each illuminating device 210 is formed of one or more fiber optic cables 240a, 240b, 240c, and 240d, each having a light emitting portion thereof disposed at a selected location within the chamber 220 for illuminating the interior contents of the chamber. While an end of each cable 240 is illustrated as located in the chamber 120 for providing illumination, it is to be appreciated that a greater length of the cable 240 (e.g., mounted along an upper periphery of the interior of the chamber) or additional lighting accessories may be disposed in the chamber to provide a desired amount of illumination. Another end of each fiber cable 240 is connected to a lamp module 270 which provides the light to cable. The lamp 270 may be integrated into the track system or it may be separate.

The illuminating devices 210 usually are selected to provide light at a wavelength so as not expose photoresist material being employed (e.g., in a developer or coater unit). For example, yellow light may be employed when the photoresist being used is exposed in response to ultraviolet light. Because of their small size and unobtrusive positioning in the chamber 220, the illuminating devices 210 do not interfere with the processing environment of the chamber. In addition, the illuminating devices 210, when activated, dissipate relatively small amounts of heat (individually and collectively) so as not to adversely interact with or otherwise impact flammable chemicals which typically are used in various types of processing chambers 220. Accordingly, the illuminating devices 210 illuminate the interior of the chamber 220 to facilitate visual inspections while mitigating a fire hazard. Illumination of the chamber 220 may be enhanced by constructing the interior sidewall 262 of the chamber of an appropriate reflective material. While a single lamp module 270 is illustrated as operating as the light source for each cable 240, it is to be appreciated that additional lamps may be utilized.

Similar to the example described with respect to FIG. 1, the illuminating devices 210 may be manually activated (e.g., by a technician) and/or may be automatically activated by a controller 230 controlling operation of the lamp 270. It is to be appreciated that the illuminating system 200 also may operate without a controller 230. For example, the illuminating devices 210 may be activated or deactivated (e.g., ON or OFF) in response to the operating condition of an associated switch device or in response to the operating state of the processing system 202.

In the example of FIGS. 2–3, the controller 230 controls operation of the lamp module 270 which, in turn, controls the illuminating devices 210. The controller 230 is programmed and/or configured to control and operate the lamp module 270 and other various components within the system 200 in order to carry out the various functions described herein. The manner in which the controller 230 can be programmed to carry out the functions relating to the present invention will be readily apparent to those having ordinary skill in the art based on the description provided herein. While the controller 230 is illustrated as being remote from the processing chamber 220, it is to be understood that the controller also may be integrated as part of the associated processing system 202 or implemented as a stand-alone controller.

In order to sense operating conditions of the chamber 220, sensors 292 are operatively connected with the chamber to sense various operating parameters thereof. The operative connection between the sensors 292 and the chamber 220 is schematically illustrated at 294. The sensors 292 may be integrated sensors of the associated processing system 202 which are used to sense operating conditions associated with the chamber 220. The sensors 292 also may include sensing equipment specifically configured to facilitate operation of the illuminating system 200. The sensors 292 provide sensor signals to the controller 230 indicative of the sensed operating conditions. The sensors 292 may be configured to sense a variety of operating conditions, such as, for example, light, temperature, pressure, vibration, rotation speed of the chuck 264, or any other condition useful in controlling the operation of the processing unit associated with the chamber 220.

The controller 230 controls operation of the lamp module 270 in response to the sensor signals. By way of example, the controller 230 may control the lamp module 270 to activate one or more of the illuminating devices 210 if the sensor signal indicates that an aspect of the process within chamber 220 is operating outside an expected operating parameter. The aspect of the system within the chamber 220 experiencing the potential problem is illuminated to facilitate its visual inspection for troubleshooting. The controller 230 also might activate an alarm or warning signal to alert the technician of a potential abnormal operating condition. In addition, the controller 230 may be programmed or configured to activate the illuminating devices 210 at selected times to assist the technician with a visual inspection of the internal operations of the chamber 220, such as at scheduled maintenance intervals.

The controller 230 also may be programmed to receive feedback related to the operation of the lamp module 270, and illuminating devices 210 (either directly from the lamp module or from one of the sensors 292). For example, the controller 230 might, based on feedback of the lamp module 270 and/or an illuminating device 210, adjust the intensity of each illuminating device to maintain a desired intensity of light within the chamber 220. The controller 230 also may control the lamp 270 to rapidly activate and deactivate the illuminating devices 210 in a strobe-light manner to help monitor and diagnose moving parts within the chamber 220 (e.g., chuck 264, nozzle arm).

It also may be desirable to selectively activate and deactivate different illuminating devices 210 at selected times according to the type of chamber 220 and/or the sensed operating conditions thereof. In a coater processing chamber, for example, illuminating devices 210a and 210c may be configured to emit light at a wavelength that matches the wavelength needed to expose photoresist (e.g., 157 nm, 193 nm, 248 nm, 365 nm, etc.) and illuminating devices 210b and 210d may be configured to emit light that does not expose the photoresist material. For example, one or more optical fibers may be located within the chamber which emit light having a wavelength which will expose the resist, while other optical fibers may be employed within the chamber which emit light in the visible spectrum to provide illumination without exposing the resist. The controller 230 controls the lamp module 270 to activate illuminating devices 210b and 210d at any time to facilitate viewing the interior of the chamber 220. However, the controller 230 controls the lamp module so as to limit activation of illuminating devices 210a and 210c to situations when no resist-coated wafer is within the chamber 220. This method of control enables the system 200 to employ the illuminating devices 210 to perform a dual purpose, namely, illuminating the interior of the chamber 220 and cleaning by exposing remaining photoresist material within the chamber 220. The exposed photoresist is easily removed from the chamber 220.

A single illuminating device 210 also may be configured to selectively emit light at two different wavelengths, such that the single illuminating device provides a dual purpose. Specifically, the controller 230 may control the lamp to activate a single illuminating device 210 to emit light at a first wavelength to expose remaining photoresist material in the chamber 220 (for cleaning purposes) and at a second wavelength to illuminate the contents of the chamber to facilitate visual inspection thereof. In cases when the optical fiber is emitting an exposing light wavelength, the processing chamber cover should be closed so as to protect personnel from exposure to such wavelengths. In addition, with regard to negative resists, a solely illuminating optical fiber system may be utilized, as may be desired.

The foregoing examples illustrate but a few approaches as to how one of ordinary skill in the art may program or otherwise configure the controller 230 to control the illuminating system 200 in accordance with the present invention. It is to be appreciated that many other control methodologies may be implemented in accordance with the present invention and that all such control methodologies are intended to fall within the scope of the appended claims.

It is to be understood that a plurality of cables and lenses may be employed to illuminate different selected portions within the chamber 220. For example, additional light sources may be located at selected portions of the chamber 120 so as to illuminate particular features relating to the mounting arrangement between the wafer 160 and chuck 164. In addition to monitoring the chuck 164 and wafer 160, one or more illuminating devices 210 may be angled so as to illuminate a nozzle arm (not shown) which may be located within the chamber 120. The nozzle arm, for example is used to apply photoresist (in a coater unit) or to apply a suitable solvent for removing exposed photoresist (in a developer unit).

Figure 4:
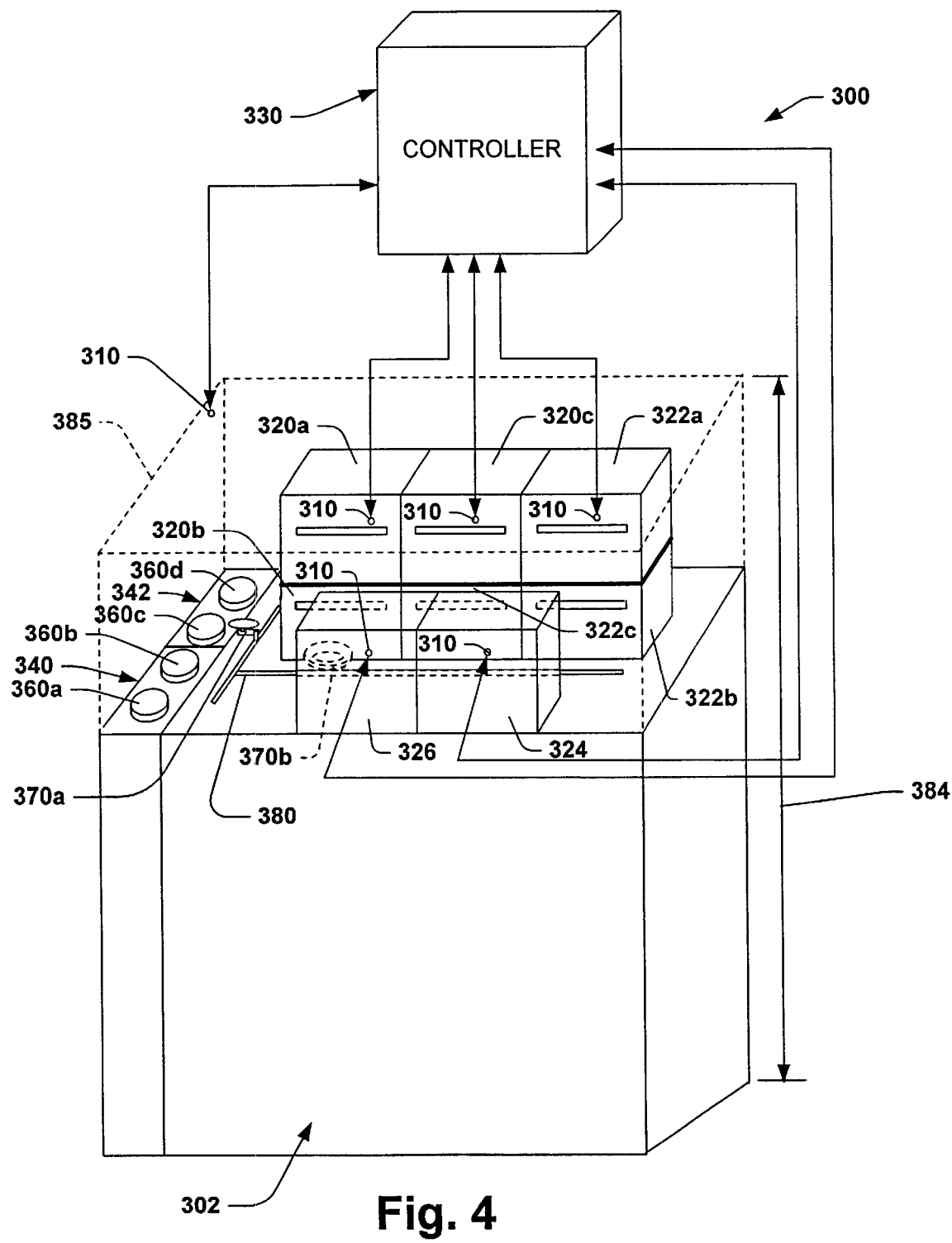
FIG. 4 is an isometric schematic illustration of a track system equipped with illuminating devices in accordance with the present invention.

FIG. 4 is a representative schematic illustration of a system 300 for illuminating a plurality of processing units of an exemplary semiconductor processing track system 302 in accordance with the present invention. The track system 302 includes a plurality of vertically stacked spin coater units 320a, 320b, 320c (hereinafter collectively referred to as 320) and spin developer units 322a, 322b, 322c (hereinafter collectively referred to as 322). Other processing units 324 and 326 may be provided for implementing other required processing steps within the track system 302. For example, unit 324 may be a baking unit (heater) and unit 326 may be a cooling unit (cooler) for selectively exposing a wafer to different controlled temperatures during the wafer fabrication process. Each of the chambers may include the illumination system described herein. With regard to the baking units, the illumination cover or optical fiber itself is adapted to withstand the elevated temperatures, whereas in the developer units, the illumination cover or optical fiber itself is adapted to withstand the various chemicals that may come into contact therewith.

The track system 302 includes receiving and sending sections 340 and 342, respectively, for storing cassettes 360a, 360b, 360c, 360d of wafers at different stages of the fabrication process. The track system 302 also includes several robotically actuated transport arms 370a, 370b (hereinafter collectively referred to as 370). Each arm 370 includes a tray having an upper surface for receiving a wafer. The arms 370 move along tracks 380 or paths for transporting wafers between the storage cassettes 360 and the processing units 320, 322, 324, and 326 of the system 302. Each of the processing units 320, 322, 324, 326 include a door through which the wafers are transported. While two arms 370 are illustrated in FIG. 4, it will be appreciated that several more arms may be used for moving wafers through the various parts of the coating and developing processes. Additional tracks also may be provided to facilitate wafer transport.

By way of example, the receiving section 340 includes one cassette 360a which contains bare wafers to which a photoresist material is to be applied or coated in the coater units 320. The arms 370 transfer a wafer from the cassette 360a to a coater unit 320 which coats a selected photoresist material onto the wafer surface. Another cassette 360b stores resist-coated wafers that have been selectively exposed to radiation, such as during a photolithography process. The arms 370 transport a wafer from the cassette 360b to a selected developer unit 322 which develops and/or removes the exposed photoresist, such as by application of a solvent. The sending section 342 includes cassettes 360c and 360d which store wafers after having been processed in the processing units 320 and 322. For example, cassette 360c receives and stores resist-coated wafers from the coater units 320 and cassette 360d receives and stores wafers after being processed in a developer unit 322.

The processing units 320, 322, 324, and 326 are located at the top part of the track system 302, which is enclosed by a housing 385 (illustrated in phantom for ease of illustration). The track system 302 also has a height, indicated at 384, which may be in excess of ten feet. While, under normal operating conditions, the track system 302 enables a manufacturer to increase production yields, the increased height has resulted in practical difficulties for semiconductor manufacturers. The processing units 320, 322, 324, and 326 include enclosed processing chambers (e.g., 120, 220 of FIGS. 1–3) which provide controlled environments for wafer processing and mitigating contamination caused by, for example, particulate material and/or unwanted light.

The ambient lighting in the room where the system 302 is situated usually is insufficient to view within the enclosure 385, especially the interior of the processing units 320, 322, 324, and 326. For example, in order to visually inspect interior parts of the system 302, such as when troubleshooting a potential abnormal operating condition, it may be necessary to remove panels of the system and/or to employ external sources of light in an effort to illuminate a selected internal part or parts of the system 302. External sources of light, however, often cast shadows on the very internal components that the technician wishes to inspect.

In accordance with the present invention, one or more illuminating devices, such as fiber optic light sources 310, are integrated into each processing unit 320, 322, 324, 326. In particular, part of each fiber optic light source 310 is mounted in an enclosed chamber (e.g., 120, 220 of FIGS. 1–3) of each processing unit 320, 322, 324, 326 and housing 385 to facilitate viewing of internal system parts not easily visible to the technician. One or more fiber optic light sources 310 also are located within the housing 385 of the track system 302 for illuminating, for example, the cassettes 360, transport arms 370, and tracks 380. The illuminating devices 310 do not dissipate large amounts of heat and, therefore, mitigate risks associated with altering or heating the flammable chemicals used in the track system 302.

The system 300 includes a controller 330 that is programmed to control operation of the illuminating devices 310. As described above with respect to FIGS. 2 and 3, for example, the controller 330 may be programmed to selectively activate and/or deactivate one or more specific illuminating devices 310 based on feedback and/or sensed operating parameters of the system 302. The sensed operating parameters are based on sensor signals provided by associated sensors (e.g., sensors 192 of FIGS. 2–3). The sensors may be integrated sensors of the track system 302 and/or additional sensors provided to specifically facilitate controlling the illumination process in accordance with the present invention. The particular manner in which the controller 330 can be programmed will be readily apparent to those having ordinary skill in the art based on the description provided herein.

It also will be appreciated that the track system 302 of FIG. 4 may be integrated with a stepper system into an integrated processing system. Additional coater and/or developer units also may be incorporated into the integrated track system 302 to further increase throughput. Each unit of the integrated system may be equipped with one or more illuminating devices (fiber optic light sources) 310 in accordance with the present invention.

Figure 5:
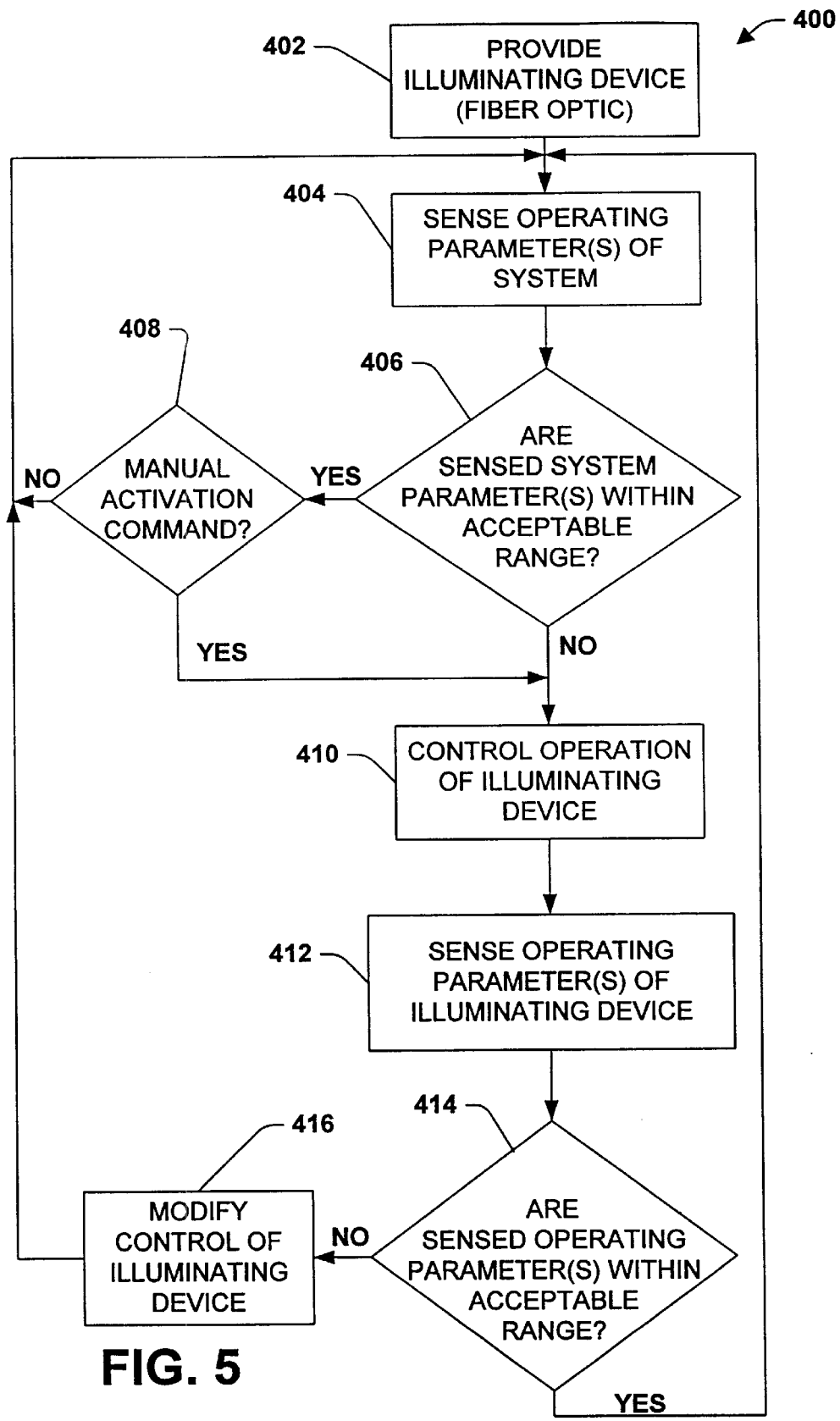
FIG. 5 is a flow diagram illustrating a method of illuminating a processing chamber in accordance with the present invention.

FIG. 5 is a flow diagram illustrating an exemplary method 400 of using an illuminating device, suitably formed of a fiber optic cable and associated lamp, to illuminate a processing chamber of a semiconductor processing system in accordance with the present invention. The method begins at step 402 in which one or more illuminating devices are provided. In particular, the illuminating device is operatively associated with the processing chamber so as to illuminate its interior, such as according the arrangements described herein. The method proceeds to step 404.

At step 404, operating parameters of the processing system are sensed. As mentioned above, this may be implemented by sensors operatively connected with the processing chamber or other parts of the system for sensing various operating conditions and providing sensor signals indicative thereof. Next, at step 406, a determination is made (e.g., by an associated controller) as to whether the sensed parameters are within an acceptable range. If the determination is affirmative, indicating that the sensed parameters are acceptable, the method proceeds to step 408.

At step 408, another determination is made as to whether a manual activation command has been received. The manual activation command may, for example, indicate to turn the illuminating device ON or OFF, depending on its current operating condition. If the determination at step 408 is negative (no manual activation command has been received), the method returns to step 404 to sense the system operating parameters and the operating state of the illuminating device remains unchanged. For purposes of ease of explanation, the method is described as if the illuminating device is initially OFF. Because, in this example, no activation command has been received, there is no activation of the illuminating device.

If the determination at step 406 is negative (indicating that one or more sensed parameters are not acceptable) or if the determination at step 408 is affirmative (indicating receipt of a manual activation command), the method proceeds to step 410. At step 410, the operation of the illuminating device is controlled. That is, the illuminating device may be controlled (e.g., turned ON or OFF) in response to (i) receiving a manual activation command and/or (ii) sensing a parameter of the system, including the processing chamber, that is outside an expected range of values. The control at step 410 also may result in a modification of the operating condition of the illuminating device. From step 410, the method proceeds to step 412.

At step 412, operating parameters of the illuminating device are sensed. The sensing may occur whether the illuminating device is ON or OFF. As mentioned above, the sensing may be in the form of feedback received from the lamp module and/or from one or more other sensors which monitor operating characteristics of the illuminating device. The method proceeds to step 414, in which a determination is made as to whether the sensed operating parameters of the illuminating device are within an acceptable range. If the determination is affirmative, indicating that the sensed parameters are within an acceptable range, the process returns to step 404. If the determination at step 414 is negative, however, indicating that one or more sensed operating parameters of the is outside an acceptable range, the method proceeds to step 416. At step 416, the control of the illuminating device is modified, such as based on its sensed operating parameters. For example, if the illuminating device is emitting too much or too little light, the intensity of light may be adjusted down or up accordingly, such as by controlling operating characteristics of the lamp module. From step 416, the method returns to step 404.

While the foregoing method of using a fiber optic light source to illuminate the interior of a chamber has been described as a series of steps, it is to be appreciated that the method may be expressed by other techniques. The operation and control of the illuminating also may be expressed, for example, as a state diagram, in which the activation and deactivation of the illuminating device are conditioned on the state of the manual activation command and/or the states of the various sensed parameters of the system and illuminating device. In addition, the particular order and/or number of the steps may be modified from that shown (as needed).

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for illuminating a semiconductor processing system, comprising:
   a processing chamber of the processing system having an interior; and
   a fiber optic light source associated with the chamber for illuminating the interior of the chamber; and
   a controller for selectively controlling activation of the light source;
   wherein the chamber is part of a coater unit of the processing system for providing a photoresist material onto a substrate, the light source providing light at a wavelength so as not to expose the photoresist material.

2. The system of claim 1, wherein the chamber is enclosed.

3. A system for illuminating a semiconductor processing system, comprising:
   a processing chamber of the processing system having an interior; and
   a fiber optic light source associated with the chamber for illuminating the interior of the chamber; and
   a controller for selectively controlling activation of the light source;
   wherein the chamber is part of a developer unit of the processing system for developing photoresist material applied to a substrate.

4. A system for illuminating a semiconductor processing system, comprising:
   illumination means operatively associated with an interior of an enclosed processing chamber of the processing system for illuminating the interior of the chamber; and
   a controller for selectively controlling activation of the illumination means;
   wherein the chamber is part of a coater unit of the processing system for providing a photoresist material onto a substrate, the illumination means providing light at a wavelength so as not to expose the photoresist material.

5. A system for illuminating a semiconductor processing system, comprising:
   illumination means operatively associated with an interior of an enclosed processing chamber of the processing system for illuminating the interior of the chamber; and
   a controller for selectively controlling activation of the illumination means;
   wherein the chamber is part of a developer unit of the processing system for developing photoresist material applied to a substrate.

6. A system for illuminating a semiconductor processing system, comprising:
   a processing chamber of the processing system having an interior;
   a fiber optic light source associated with the chamber for illuminating the interior of the chamber;
   a sensor associated with the processing chamber, the sensor being adapted to sense an operating condition of the processing system and to communicate an indication of the sensed operating condition; and
   a controller coupled with the fiber optic light source and the sensor to receive the indication from the sensor and to control activation of the fiber source based on the indication from the sensor.

7. The system of claim 6, wherein the processing chamber comprises a wafer chuck having a pedestal associated therewith upon which a wafer resides and a rotatable support member adapted to support and rotate the wafer chuck within the processing chamber, and wherein the fiber optic light source is adapted to illuminate a bottom portion of the chuck or the rotatable support member visual inspection thereof by a technician.

8. The system of claim 7, wherein the sensor is adapted to sense an operating condition of the bottom portion of the chuck or the rotatable support member and to communicate an indication of the sensed operating condition of the bottom portion of the chuck or the rotatable support member to the controller, and wherein the controller is adapted to selectively control activation of the fiber optic light source based on the indication of the sensed operating condition of the bottom portion of the chuck or the rotatable support member.

9. The system of claim 7, wherein the controller is adapted to rapidly activate and deactivate the fiber optic light source in a strobe-like manner to facilitate visual monitoring of the chuck when rotated by the rotatable support member.

10. The system of claim 7, wherein the controller is adapted to rapidly activate and deactivate the fiber optic light source in a strobe-like manner to facilitate visual monitoring of the chuck.

11. A system for illuminating a semiconductor processing system, comprising:

illumination means operatively associated with an interior of an enclosed processing chamber of the processing system for illuminating the interior of the chamber;

a controller for selectively controlling activation of the illumination means; and a sensor adapted to sense an operating condition of the processing system and to communicate an indication of the sensed operating condition, wherein the controller is coupled with the illumination means and the sensor to receive the indication from the sensor and to control activation of the illumination means based on the indication from the sensor.

12. The system of claim 11, wherein the chamber is enclosed.

13. The system of claim 11, wherein the processing chamber comprises a wafer chuck having a pedestal associated therewith upon which a wafer resides and a rotatable support member adapted to support and rotate the wafer chuck within the processing chamber, wherein the illumination means is adapted to illuminate a bottom portion of the chuck or the rotatable support member for visual inspection thereof by a technician, wherein the sensor is adapted to sense an operating condition of the bottom portion of the chuck or the rotatable support member and to communicate an indication of the sensed operating condition of the bottom portion of the chuck or the rotatable support member to the controller, and wherein the controller is adapted to selectively control activation of the illumination means based on the indication of the sensed operating condition of the bottom portion of the chuck or the rotatable support member.

14. The system of claim 13, wherein the controller is adapted to rapidly activate and deactivate the illumination means to facilitate visual monitoring of the chuck when rotated by the rotatable support member.

\* \* \* \* \*